United States Patent
Winter

(10) Patent No.: US 6,548,576 B1
(45) Date of Patent: Apr. 15, 2003

(54) EPOXY FORMULATION ADAPTED TO BE USED IN CONJUNCTION WITH NO-LEAD SOLDER IN ELECTRONIC COMPONENTS

(75) Inventor: Raymond L. Winter, Trona, CA (US)

(73) Assignee: Bourns, Inc., Riverside, CA (US)

( * ) Notice: Subject to any disclaimer, the term of this patent is extended or adjusted under 35 U.S.C. 154(b) by 0 days.

(21) Appl. No.: 10/045,461

(22) Filed: Nov. 7, 2001

(51) Int. Cl.[7] .............................. C08K 3/36; C08L 63/02
(52) U.S. Cl. ..................... 523/458; 523/466; 525/484; 525/523; 528/94; 528/103; 528/116; 528/117; 528/122; 528/123
(58) Field of Search .................................. 523/458, 466; 525/484, 523; 528/94, 103, 116, 117, 122, 123

(56) References Cited

U.S. PATENT DOCUMENTS

| | | |
|---|---|---|
| 3,868,613 A | 2/1975 | Rogers, Jr. et al. |
| 4,137,275 A | 1/1979 | Smith et al. |
| 4,210,704 A | 7/1980 | Chandross et al. |
| 4,328,150 A | 5/1982 | Kondow et al. |
| 4,368,299 A | 1/1983 | Watanabe et al. |
| 4,631,230 A | 12/1986 | Torossian et al. |
| 4,692,499 A | 9/1987 | Torossian et al. |
| 4,701,481 A | 10/1987 | Bogan et al. |
| 4,931,515 A | 6/1990 | Takagishi et al. |
| 5,049,596 A | 9/1991 | Fujimoto et al. |
| 5,171,769 A | * 12/1992 | Bull .......................... 513/447 |
| 5,484,854 A | 1/1996 | Tsumura et al. |

FOREIGN PATENT DOCUMENTS

| | | |
|---|---|---|
| EP | 0230328 | 7/1987 |
| EP | 0526895 | 2/1993 |
| EP | 0735071 | 3/1995 |
| EP | 0683190 | 11/1995 |
| PE | 0498505 | 8/1992 |

* cited by examiner

*Primary Examiner*—Margaret G. Moore
*Assistant Examiner*—D. Aylward
(74) *Attorney, Agent, or Firm*—Klein, O'Neill & Singh, LLP

(57) ABSTRACT

A one part, several-months-useful-shelf-life epoxy material suitable for potting and sealing electronic components, and which is compatible with the high, approximately 255° C. to 275° C. temperatures required for soldering modem lead-free solders comprises an intimate mixture of the following components: approximately 2 to 13 per cent by weight of diglycidyl ether bisphenol A resin; approximately 40 to 70% phenol formaldehyde resin and the following further components

[(2-methylphenoxy)methyl]-oxirane or o-cresol glycidyl ether) 0.5–8% by weight;

polypropyleneglycol-glycidyl ether resin (plasticizer) 2–10% by weight;

cycloaliphatic polyamine (catalyst) 4–15% by weight;

kaolin clay (filler) 2–20% by weight;

magnesium alumino silicate (filler) 2–15% by weight;

$Sb_2O_3$ (filler) 4–5% by weight, and hydrated $Al_2O_3$ (filler) 0–15% by weight.

4 Claims, No Drawings

EPOXY FORMULATION ADAPTED TO BE USED IN CONJUNCTION WITH NO-LEAD SOLDER IN ELECTRONIC COMPONENTS

BACKGROUND OF THE INVENTION

1. Field of the Invention

The present invention is in the field of epoxy formulations to be used primarily as potting and sealing material in electronic components. More specifically, the present invention relates to an improved epoxy formulation that is adapted to be used in electronic components in conjunction with no-lead solder materials which require higher soldering temperatures than conventional lead-based solders.

2. Brief Description of Background Art

Epoxy formulations in the electronic industry are used for potting and sealing electronic components, such as resistors, resistor networks and trimming potentiometers. In the past the electronic industry used primarily lead-based solders, and prior art epoxy formulations functioned adequately when exposed to the soldering temperatures employed in conjunction with lead-based solders. However, the electronic industry is gradually moving away from using lead-based solders. Instead, the use of lead-free silver-copper-nickel-cobalt-bismuth based solders is gradually becoming the standard in the industry. Prior art epoxy formulations do not perform well when exposed to the higher (approximately 225° C. to 275° C.) temperatures required by the use of lead-free silver-copper-nickel-cobalt-bismuth based solders, because the conventional epoxy formulations tend to degrade and crack when exposed to these temperatures. In experiments performed comparing the novel epoxy formulation of the present invention with the conventional prior art epoxy formulations, the conventional prior art formulations often char, turn dark brown or black, become brittle, crack internally, separate from a component polymeric housing, from a ceramic substrate, and/or from a metal wire or other metal connector when processed at the higher temperatures (approximately 255° C. to 275° C.) required for the lead free solder re-flow, or after such process is followed by one or more thermal shock cycles (example: cooling to −65° C. and warming +150° C.). The conventional, prior art epoxy formulations also exhibit significant adhesive and/or cohesive cracks of the cured epoxy, after several infrared furnace solder re-flow cycles are followed by several thermal shocks between −65° C. and +150° C.

Attempts to provide epoxy formulations which would be compatible with the modern lead-free high-temperature solders by providing epoxy materials containing significant quantities of high temperature resins are, generally speaking, unsuccessful, because when such high temperature resins are used in the epoxy, then the epoxy becomes brittle and cracks at low (−65° C.) temperature. Another disadvantage perceived in the prior art of using a high-temperature resin is that such resins require more aggressive catalysts than standard resins, and the shelf-life of a single part epoxy formulation containing such more aggressive catalysts, generally speaking, is too short to be acceptable. In this connection it will be readily understood by those skilled in the art that a single-part epoxy formulation is a formulation where the catalyst is mixed in with the formulation and no further mixing of a component or ingredient is required before the epoxy is employed for its intended use. This is to be contrasted with a two-part formulation, where one part contains the catalyst, the second part contains another ingredient or component essential for curing, and where the two parts have to be mixed for the curing process to begin.

Thus, there is a need in the state-of-the-art for a single part epoxy formulation to be used in electronic components and the like, which formulation is compatible with the use of modern lead-free solders requiring high (approximately 255° C. to 275° C.) temperatures for soldering, withstands cold and hot thermal shock cycles without significant deterioration, and which has an acceptable shelf-life. The present invention provides such an improved epoxy formulation.

The following United States and foreign patents or published patent applications serve as background to the present invention: U.S. Pat. No. 5,484,854; U.S. Pat. No. 5,049,596; U.S. Pat. No. 4,931,515; U.S. Pat. No. 4,701,481; U.S. Pat. No. 4,692,499; U.S. Pat. No. 4,631,230; U.S. Pat. No. 4,368,299; U.S. Pat. No. 4,328,150; U.S. Pat. No. 4,210,704; U.S. Pat. No. 4,137,275; U.S. Pat. No. 3,868,613; EPA 95100013.2; EPA 92113404.5; EPA 96301875.9; EPA 92200299.3 and EPA 87200018.7.

SUMMARY OF THE INVENTION

In accordance with the present invention an epoxy formulation or material is provided which is suitable for potting and sealing electronic components, and is compatible with the high (approximately 255° C. to 275° C.) temperature required for soldering modern lead-free solders. The epoxy material or epoxy formulation comprises approximately 2 to 13 per cent by weight of diglycidyl ether bisphenol A, a resin which is a low temperature resin (all percentages are by weight unless otherwise indicated), and approximately 40 to 70% phenol formaldehyde resin which is a high temperature resin. The formulation comprises the following further components in the following percentage ratios:

| | |
|---|---|
| [(2-methylphenoxy)methyl]-oxirane or o-cresol glycidyl ether) | 0.5–8% |
| Polypropyleneglycol-glycidyl ether resin (plasticizer) | 2–10% |
| Cycloaliphatic polyamine (catalyst) | 4–15% |
| Kaolin clay (filler) | 2–20% |
| Cordierite (Magnesium Alumino Silicate) (filler) | 2–15% |
| $Sb_2O_3$ (filler) | 4–15% |
| Hydrated $Al_2O_3$ (filler) | 0–15% |

The above-enumerated components of the composition are thoroughly admixed at ambient temperature that preferably does not exceed 90° C. Surprisingly, although the epoxy composition of the invention includes a more aggressive catalyst, it has a shelf-life of approximately 4 to 12 months. It is applied manually or by machinery to coat surfaces, fill cavities and serve for potting and sealing parts on electronic components. The epoxy composition is cured by exposure to heat in the temperature range of 120° C. to 170° C. for approximately 60 to 240 minutes. Again, surprisingly, although the composition of the invention includes a relatively high percentage of phenol formaldehyde (high temperature) resin, it is not only capable of withstanding the soldering temperatures of approximately 255° C. to 275° C., but it also withstands without significant deterioration several thermal shock cycles which include cooling to −65° C. and heating to +150° C.

DETAILED DESCRIPTION OF THE INVENTION

The novel epoxy formulation or composition of the present invention includes the components or ingredients described above in the Summary Section of the present application for patent. These listed components or ingredients are well known per se and are available commercially. It should be understood in connection with the herein listed ranges of percentages of the components, that it is not contemplated within the scope of the invention to have all or most of the ingredients present in their respective maximum listed range in any given composition, as such a composition would be incapable of existence for having more than 100% of the sum of its components. Rather it is contemplated that when one or more ingredients are in their maximum range, then the ratios of other components are in less than their maximum range, so that the sum total of all components is 100%.

Industrial grade materials can be and preferably are used in the composition of the invention. Certain incidental impurities are frequently present in industrial grade materials and are considered in the art a normal aspect of the manufacturing of epoxy materials. A person having ordinary skill in the art will know how to adjust ratios of the ingredients from lot to lot, requiring no more than routine experimentation, in order to compensate for any untoward effect of incidental impurities in the materials.

As is noted above, the epoxy formulation or composition of the present invention has surprising advantageous properties, which include the reasonably long shelf-life in spite of the use of a "more aggressive" cycloaliphatic polyamine catalyst, the ability to withstand without significant deterioration the high soldering temperature used in conjunction with lead-free solders, and the ability to withstand cold temperature (−65° C.) in spite of the use of a significant quantity of high temperature phenol formaldehyde resin. These surprising and advantageous properties are due to the unique combination of the several ingredients in the ratios provided.

A more preferred general range of the components or ingredients of the composition is provided below:

| | |
|---|---|
| diglicidyl ether bispbenol A | 7.00–9.94% |
| phenol formaldehyde resin | 45.33–46.73% |
| [(2-methylphenoxy)methyl]-oxirane or o-cresol glycidyl ether | 1.30–1.85% |
| Polypropyleneglycol-glycidyl ether resin (plasticizer) | 3.50–5.35% |
| Cycloaliphatic polyamine (catalyst) | 5.96–6.48% |
| Kaolin clay (filler) | 13.54–17.85% |
| Cordierite (Magnesium Alumino Silicate) (filler) | 6.21–7.28% |
| Sb$_2$O$_3$ (filler) | 6.80–7.40% |
| Hydrated Al$_2$O$_3$ (filler) | 1.04–7.38% |

One preferred specific embodiment has the following components in the below-provided ratios:

| | |
|---|---|
| diglicidylether bisphenol A | 2.24% |
| phenol formaldehyde NOVOLAC ® resin | 46.28% | a commercially available mixture of 30 weight % o-cresol glycidyl ether with 70 weight % bisphenol A epoxy resin, 4.40% by weight of the total composition, thus containing 1.32% of o-cresol glycidyl ether and 3.08% bisphenol A epoxy resin relative to the total weight of the composition;

a commercially available mixture of 30–44 weight % diglycidylether bisphenol A with 56–70 weight % of polypropyleneglycol-glycidyl ether resin, 6.40% by weight of the total composition, thus containing 1.92 to 2.816 % diglycidylether bisphenol A, and to 3.584 to 4.48% polypropyleneglycol-glycidyl ether resin relative to the total weight of the composition;

| | |
|---|---|
| Cycloaliphatic polyamine | 6.00% |
| Kaolin clay | 13.72% |
| Cordierite (Magnesium Alumino Silicate) | 6.28% |
| Sb$_2$O$_3$ | 7.32% |
| Hydrated Al$_2$O$_3$ (filler) | 7.36% |

Another preferred specific embodiment has the following components in the below-provided ratios:

| | |
|---|---|
| diglicidylether bisphenol A | 2.08% |
| phenol formaldehyde NOVOLAC ® resin | 45.37% | a commercially available mixture of 30 weight % o-cresol glycidyl ether with 70 weight % bisphenol A epoxy Resin, 6.12% by weight of the total composition, thus containing 1.836% of o-cresol glycidyl ether and 4.284% bisphenol A epoxy resin relative to the total weight of the composition;

a commercially available mixture of 30–44 weight % diglycidylether bisphenol A with 56–70 weight % polypropyleneglycol-glycidyl ether resin, 7.60% by weight of the total composition, thus containing 2.28 to 3.344% of diglycidylether bisphenol A and 4.256 to 5.32% of polypropyleneglycol-glycidyl ether resin;

| | |
|---|---|
| Cycloaliphatic polyamine | 6.00% |
| Kaolin clay | 17.67% |
| Cordierite (Magnesium Alumino Silicate) | 7.24% |
| Sb$_2$O$_3$ | 6.84% |
| Hydrated Al$_2$O$_3$ (filler) | 1.08% |

All of the above-listed components of the specific embodiments are available in accordance with the state of the art. The specific embodiments can be prepared from the following commercially available materials, with the name of the supplier and any brand name or material designation indicated next to the supplier's name.

diglicidylether bisphenol A: DOW CHEMICAL COMPANY—DER 331;

phenol formaldehyde NOVOLAC® resin: DOW CHEMICAL COMPANY —DEN 431;

a mixture of 30 weight % o-cresol glycidyl ether with 70 weight % bisphenol A;

epoxy resin: CELANESE RESINS—EPI-REZ 5077 or SHELL EPON 813;

a mixture of 30–44 weight % diglycidylether bisphenol A with 56–70 weight %;

polypropyleneglycol-glycidyl ether resin: CIBA GEIGY—ARALDITE GY 508;

Cycloaliphatic polyamine: AIR PRODUCTS AND CHEMICALS—ANCAMINE 2441;

Kaolin clay: GEORGIA KAOLIN INC—HYDRITE R (heat treated);

Cordierite (Magnesium Alumino Silicate): INDUSTRIAL CORPORATION—MAGNESIUM ALUMINO SILICATE HC 11 (heat treated);

Sb$_2$O$_3$: ANZON AMERICAL GRADE TMS or AMSPEC KR GRADE;

Hydrated $Al_2O_3$ (filler): ALCOA Hydrated $Al_2O_3$ TYPE C 330.

The kaolin clay (Hydrite R) is best in performance when heat treated for a minimum of 18 hours at 85° C. to 95° C.

The process of admixing the components of the epoxy formulation of the invention is performed at ambient pressure under atmospheric pressure or under slight vacuum. The temperature during the mixing is at ambient, and external cooling of the vessel where the mixing is performed may be required to prevent rising of the temperature above 90° C. due to exothermic heat of mixing. The temperature can also be lowered as low as approximately 10° C. during the mixing, but freezing is to be avoided. The time of mixing may be varied from 20 minutes to several hours. In this regard it is to be understood that thorough admixing of all components is necessary to obtain a uniform product. However, excessive work of mixing shortens the molecular chain length of the polymers in the product, and is to be avoided. In this connection it will be understood by those skilled in the art that the time of mixing is to be decreased as the shear work per minute increases. Thus, generally speaking, the shear rate in the mixing equipment determines the work for mixing, and therefore the time needed to obtain a uniform product without degrading the polymers in the composition.

The epoxy composition of the invention has a shelf life of four to twelve months, although some of the commercially available constituents are distributed with a notice of advising an expected useful life of 6 months, so that a more restrictive and commercially recommendable shelf-life of the composition of the invention is 4 to 6 months.

The epoxy formulation is used in the manner normally known and utilized in the electronic industry, that is for filling cavities, potting and sealing. After being applied by hand or by machinery the epoxy formulation is cured by being heated in the range of 120 to 170° C., preferably at 150° for approximately 60 to 240 minutes.

Utilizing lead-free solder is not part of the present invention per se, however, as noted above, a principal advantage of the epoxy composition of the present invention is that it withstands without any significant cracking, charring or other deterioration, the temperatures of 245 to 270° C., utilized in soldering with modern lead-free solders.

Several modifications of the herein described invention may become readily apparent to those skilled in the art in light of the present disclosure. Therefore, the scope of the present invention should be determined solely from the appended claims as such claims are read in light of the disclosure.

What is claimed is:

1. An epoxy composition adapted for sealing and potting electronic components and to be used in conjunction with lead-free soldering materials, the composition comprising:

2 to 13 per cent by weight of diglycidyl ether bisphenol A resin;

40 to 70% phenol formaldehyde resin;

0.5–8 per cent by weight of a material selected from the group consisting of [(2-methylphenoxy)methyl]-oxirane and o-cresol glycidyl ether);

2–10 per cent by weight of polypropyleneglycol-glycidyl ether resin;

4–15 per cent by weight of cycloaliphatic polyamine

2–20 per cent by weight of kaolin clay

2–15 per cent by weight of magnesium alumino silicate;

4–15 per cent by weight $Sb_2O_3$, and

0–15 per cent by weight of hydrated $Al_2O_3$, said percentages being selected such that the total percentage of the components does not exceed 100%, and said components being intimately admixed in said composition.

2. An epoxy composition in accordance with claim 1 wherein the components are present in the following percentages by weight:

diglicidyl ether bisphenol A resin 7.00 to 9.94%;

phenol formaldehyde resin 45.33 to 46.73%;

a material selected from the group consisting of [(2-methylphenoxy)methyl]-oxirane and o-cresol glycidyl ether 1.30 to 1.85%;

polypropyleneglycol-glycidyl ether resin 3.50 to 5.35%;

cycloaliphatic polyamine 5.96 to 6.48%;

kaolin clay 13.54 to 17.85%;

magnesium alumino silicate 6.21 to 7.28%

$Sb_2O_3$ 6.80 to 7.40%, and hydrated $Al_2O_3$ 1.04 to 7.38%, said percentages being selected such that the total percentage of the components does not exceed 100%.

3. An epoxy composition in accordance with claim 1 wherein the components are present in the following percentages by weight:

diglicidylether bisphenol A 7.24 to 8.136% phenol formaldehyde resin approximately 46.28% o-cresol glycidyl ether approximately 1.32%;

polypropyleneglycol-glycidyl ether resin approximately 3.584 to 4.48%;

cycloaliphatic polyamine approximately 6.00%;

kaolin clay approximately 13.72%;

magnesium alumino silicate approximately 6.28%;

$Sb_2O_3$ approximately 7.32%, and hydrated $Al_2O_3$ approximately 7.36%, said percentages being selected such that the total percentage of the components does not exceed 100%.

4. An epoxy composition in accordance with claim 1 wherein the components are present in the following percentages by weight:

diglicidylether bisphenol A resin 8.644 to 9.708% phenol formaldehyde resin approximately 45.37% o-cresol glycidyl ether approximately 1.836%;

polypropyleneglycol-glycidyl ether resin 4.256 to 5.32%;

cycloaliphatic polyamine approximately 6.00% kaolin clay approximately 17.67% magnesium alumino silicate approximately 7.24%

$Sb_2O_3$ approximately 6.84%, and hydrated $Al_2O_3$ approximately 1.08%;

said percentages being selected such that the total percentage of the components does not exceed 100%.

* * * * *

UNITED STATES PATENT AND TRADEMARK OFFICE
CERTIFICATE OF CORRECTION

PATENT NO. : 6,548,576 B1 Page 1 of 1
DATED : April 15, 2003
INVENTOR(S) : Raymond L. Winter It is certified that error appears in the above-identified patent and that said Letters Patent is hereby corrected as shown below:

<u>Title page,</u>
Item [57], ABSTRACT,
Line 17, please change "4-5%" to read -- 4-15% --

<u>Column 6,</u>
Line 6, please change "Al$_{2O3}$" to read -- Al$_2$O$_3$, --

Signed and Sealed this

Ninth Day of September, 2003

JAMES E. ROGAN
*Director of the United States Patent and Trademark Office*